United States Patent
Tanaka

(10) Patent No.: US 6,583,349 B2
(45) Date of Patent: Jun. 24, 2003

(54) SOLAR ENERGY CONVERTER USING A SOLAR CELL IN A SHALLOW LIQUID LAYER

(76) Inventor: Kunihide Tanaka, 5131 Bordeaux Ave., Irvine, CA (US) 92604

( * ) Notice: Subject to any disclaimer, the term of this patent is extended or adjusted under 35 U.S.C. 154(b) by 0 days.

(21) Appl. No.: 10/154,668

(22) Filed: May 22, 2002

(65) Prior Publication Data

US 2003/0029497 A1 Feb. 13, 2003

Related U.S. Application Data

(63) Continuation-in-part of application No. 09/887,416, filed on Jun. 22, 2001.

(51) Int. Cl.[7] ............... H01L 31/048; H01L 31/052
(52) U.S. Cl. ............... 136/246; 136/251; 136/259; 257/433; 257/436; 257/461
(58) Field of Search ............... 136/246, 251, 136/259; 257/433, 436, 461

(56) References Cited

U.S. PATENT DOCUMENTS

| | | | |
|---|---|---|---|
| 4,045,246 A | 8/1977 | Mlavsky et al. | 136/89 |
| 4,143,233 A | 3/1979 | Kapany et al. | 136/89 |
| 4,169,738 A | 10/1979 | Luque | 136/89 |
| RE30,584 E | 4/1981 | Russell | 136/246 |
| 6,018,122 A * | 1/2000 | Hibino et al. | 136/246 |

* cited by examiner

*Primary Examiner*—Nam Nguyen
*Assistant Examiner*—Brian L Mutschler

(57) ABSTRACT

Solar cells operating in liquid have an increased operating efficiency resulting from two independent physical phenomena, an increase in output current from the solar cells from simply wetting the solar cells, and enhanced collection of light through refraction and inner reflection of light in the liquid. Dielectric liquids are found to increase output power efficiency of n/p junction solar cells and also function as a medium for optical concentration. The properties of dielectric liquid permit the construction of a solar cell panel with a suitable geometry for functioning as an optical concentrator.

18 Claims, 8 Drawing Sheets

SOLAR ENERGY CONVERTER USING A SOLAR CELL IN A SHALLOW LIQUID LAYER

The present application is a continuation-in-part of U.S. patent application Ser. No. 09/887,416, filed Jun. 22, 2001, entitled "Solar Energy Converter Using Optical Concentration Through A Liquid".

BACKGROUND OF THE INVENTION

Solar energy systems have been used to provide electricity and heat for decades. Designers of all types of energy generation systems continually strive to improve output power efficiency. One current problem in a solar cell energy conversion system is the efficient extraction of low-cost electricity. The conversion efficiency of a photovoltaic cell is the proportion of sunlight energy that the cell converts to electrical energy. Improving efficiency is vital to producing solar cells that are competitive with traditional energy sources, such as fossil fuels and nuclear power. The efficiency of solar cells has increased substantially for the earliest conventional photovoltaic devices from about 1 to 2% efficiency. Current conventional photovoltaic systems convert 7% to 17% of light energy into electrical energy.

What is first needed is a system and method for converting energy in a solar cell with extremely high efficiency. What are also needed are solar cell materials and structures, and solar cell fabrication procedures that are inexpensive while attaining high levels of efficiency in energy generation. A further need is a solar cell configuration that permits collection of concentrated sunlight energy for conversion to electricity to increase output power generation.

SUMMARY OF THE INVENTION

Solar cells operating in liquid have an increased operating efficiency resulting from two independent physical phenomena, an increase in output current from the solar cells from simply wetting the solar cells, and enhanced collection of light through refraction and inner reflection of light in the liquid. Dielectric liquids are found to increase energy conversion efficiency of n/p junction solar cells and also function as a medium for optical concentration. The properties of dielectric liquid permit the construction of a solar cell panel with a suitable geometry for functioning as an optical concentrator.

An organic dielectric liquid immersing one or more junction photovoltaic cells increases the energy conversion efficiency of the photovoltaic cells. The organic dielectric liquid also is a highly suitable medium for usage as an optical concentrator. The organic dielectric liquid in combination with the junction photovoltaic cells operates as a highly efficient and low-cost optical concentrator.

According to one aspect of the present invention, the energy conversion efficiency of a solar cell or photovoltaic cell is increased by wetting of the surfaces of the cell with a dielectric liquid.

According to another aspect of the present invention, a solar panel configured as an encapsulation system containing photovoltaic cells and organic dielectric liquid increases the output power of a solar cell or photovoltaic cell. The solar panel has a suitable geometry for refracting illumination through the organic dielectric liquid to further increase the output power. For example, panel walls have suitable transparency for operation as a light beam collector. Illumination collected through the light beam collector refracts at the boundary of the organic dielectric liquid and enhances the photoelectric effect of the photovoltaic cells.

According to another aspect of the present invention, wetting of the solar cells with the organic dielectric liquid in combination with configuration of the solar panels as encapsulation system with walls operating as light beam collectors greatly improves output power and reduces cost per watt.

According to a further aspect of some embodiments of the present invention, the solar panel can be in the form of a low height dome or cylindrical structure with a substantially flat panel tray covering a first end of the cylinder and a panel cover or lid covering a second end of the cylinder. All or a portion of the panel walls and the panel lid are transparent for functionality as a light collector. The horizontal cross-section of the cylinder can have any suitable shape such as a circle, an ellipse, an oval, an egg-shape, a rectangle, a triangle, and a square. The horizontal cross-section of the cylinder can be symmetric or asymmetric.

Any organic dielectric liquid, whether polar or nonpolar, is suitable for usage in a solar panel. Greater energy conversion efficiency is attained for a polar organic dielectric liquid with increasing efficiency for liquids with a relatively higher index of refraction. The organic dielectric liquid can be further selected based on the melting point and the boiling point of various liquids for solar energy systems according to seasonal weather and climate of practical usage. For example, the liquid can be selected based on values of the lowest and highest temperature of the geographical area in which the solar energy system is used.

According to another aspect of the present invention, an increase in output power from a solar cell or photovoltaic cell, both of which use p-n junctions, can be obtained by deposition of a solid dielectric film, the dipoles of which are polarized perpendicular to the surface planes of the solar cell over the surfaces of the solar cell.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

DETAILED DESCRIPTION

Figure 1:
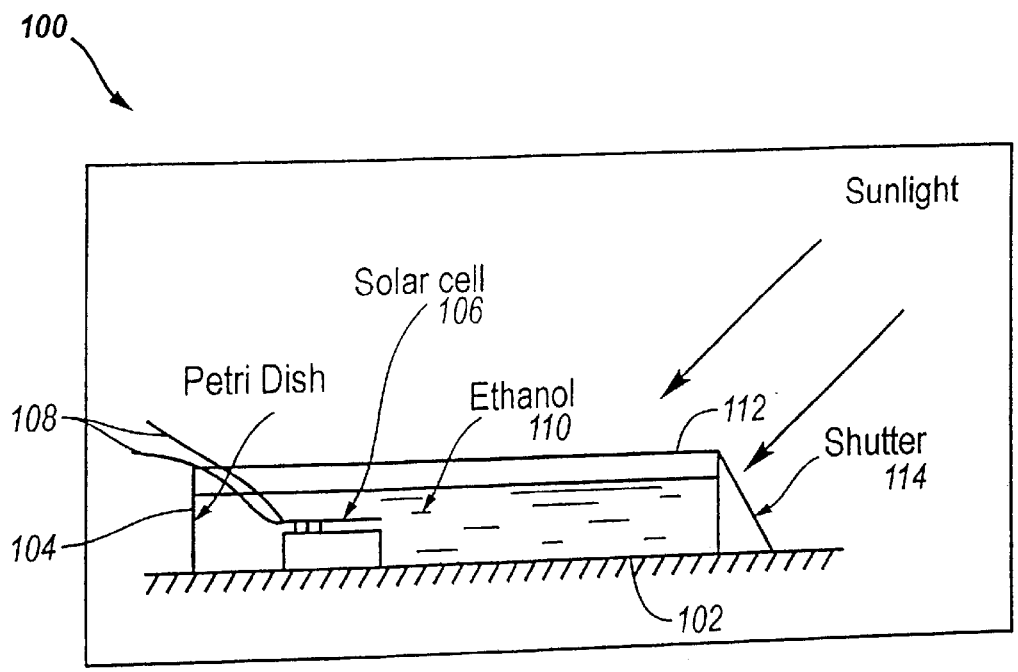
FIG. 1 is a schematic block diagram showing an example of a solar panel in a configuration for improving energy conversion efficiency.

Referring to FIG. 1, a schematic block diagram depicts an example of a solar panel 100 in a suitable configuration for improving energy conversion efficiency. The solar panel 100 includes a panel base or tray 102 that forms a lower surface wall of the solar panel 100, and panel walls 104 on all sides of the solar panel 100 The solar panel 100 can have any shape. In one set of highly suitable examples, the solar panel 100 has the form of a low height cylindrical structure with the panel tray 102 covering one end of the cylinder and a panel lid 112 covering a second end of the cylinder. All or a portion of the panel walls 104 and the panel lid 112 are transparent to promote functionality as a light collector. The horizontal cross-section of the cylinder can have any suitable shape such as a circle, an ellipse, an oval, an egg-shape, a rectangle, a triangle, and a square. The cross-section of the cylinder can be symmetric or asymmetric. Generally a solar panel 100 with a simple shape is generally most cost-effective.

The panel walls 104 improve output power efficiency of the solar panel 100 in two ways. First, and most obviously, the panel walls 104 hold the organic dielectric liquid 110 in the panel tray 102 and the liquid increases the energy conversion efficiency of photovoltaic cells 106. Second, the panel walls 104 can be transparent to function as a light collector that can add additional large increases to the output power of the solar cell. The panel walls 104 can be geometrically configured to operate as a lens containing the refractive liquid, forming an optical system that amplifies the power-enhancing effect of the liquid. In one example, the panel walls 104 can have the form of a curved lens for focusing the sunlight on the photovoltaic cell 106.

In one example, the solar panel 100 has a rectangular shape and accordingly has four panel walls 104. Many other examples can have different geometric forms including various numbers of straight sides, curved forms, or combinations of sides and curves. The panel walls 104 and panel tray 102 intersect in liquid-tight connections so that the solar panel 100 holds liquid essentially without leakage.

The solar panel 100 is configured as an encapsulation system or container that contains the photovoltaic cells 106 and the organic dielectric liquid 110 in a suitable geometry for refracting illumination through the organic dielectric liquid 110, further enhancing the output power. The panel walls 104 have suitable transparency for operation as a light beam collector. Illumination collected through the light beam collector refracts at the boundary with the organic dielectric liquid 110 and enhances the photoelectric effect of the photovoltaic cells 106.

One or more junction photovoltaic cells 106 are arranged in the panel tray 102 in such a manner that both front and rear surfaces of the solar cells 106 are wetted with the organic dielectric liquid 110. A solar panel 100 typically has many photovoltaic cells 106. Power leads 108 are connected to the photovoltaic cells 106 for connection to an external load (not shown). The photovoltaic cells 106 can be arranged in any suitable configuration in the panel tray 102, either removed from or in connection with any of the panel walls 104.

In some embodiments, the encapsulation system has a base or panel tray 102 and cover or panel lid 112 area that is substantially larger than total surface area covered by the one or more photovoltaic cells 106 so that more illumination through the panel walls 104 is collected to convert to electricity.

In one example the photovoltaic cells 106 can be silicon junction solar cells. Other types of photovoltaic cells 106 can be used such as gallium-arsenide cells and the like.

The panel tray 102 contains an organic dielectric liquid 110 that partially or fully immerses the one or more photovoltaic cells 106. The organic dielectric liquid 110 increases the efficiency of junction photovoltaic cells 106. The organic dielectric liquid 110 also has the property of a highly suitable medium for usage as an optical concentrator. The organic dielectric liquid 110 in combination with the junction photovoltaic cells 106 operates as a highly efficient and low-cost photo-electric generator.

The particular organic dielectric liquid 110 can be selected based on various conditions of usage. The output power of photovoltaic cells 106 increases simply by wetting the surfaces of the photovoltaic cells 106 with an electrically nonconductive liquid, for example even water. The amount of increase in output power of the photovoltaic cells 106 due to wetting depends on properties of the particular liquid such as polar or non-polar character, index of refraction, and other properties. The increase in output power occurs even when only a single surface of the photovoltaic cell 106 becomes wet.

Figure 2:
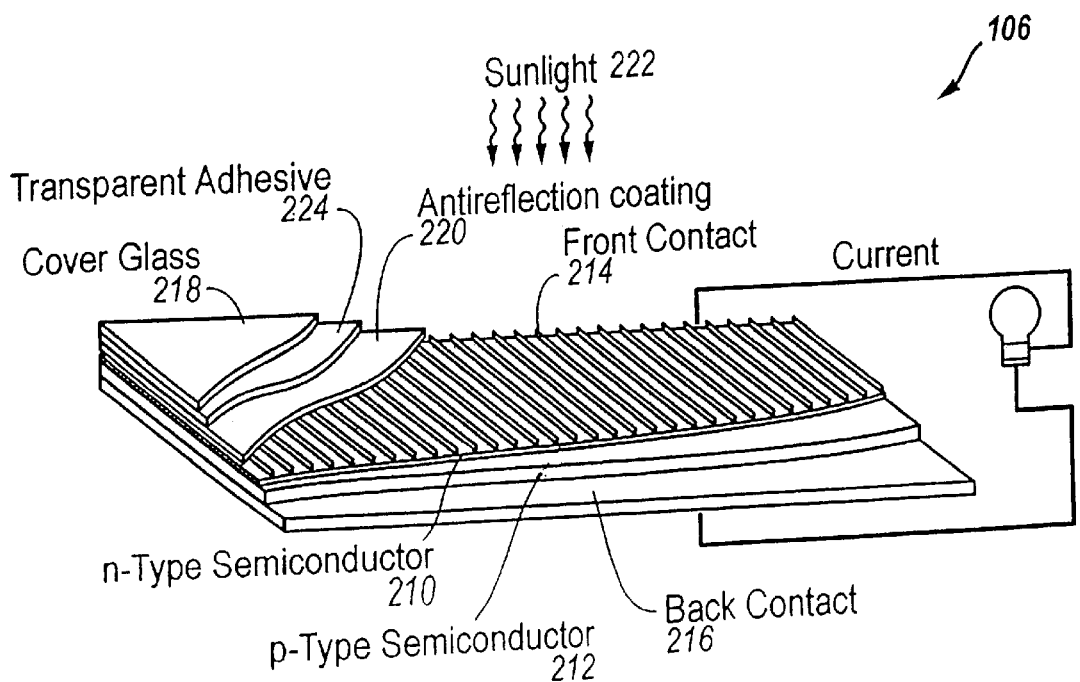
FIG. 2 is a schematic pictorial diagram that illustrates an example of a photovoltaic cell that is suitable for usage in the solar panel.

Referring to FIG. 2, a schematic pictorial diagram illustrates an example of an n/p junction photovoltaic cell 106 that is suitable for usage in the solar panel 100. The photovoltaic cell 106 includes a plurality of semiconductor layers including an n-type semiconductor 210 and a p-type semiconductor 212. The semiconductor layers including n/p junction generate an electric current in response to application of sunlight impinging on the photovoltaic cell 106. Various materials are suitable for usage in the semiconductor layers including single crystal silicon, multicrystalline silicon, amorphous silicon, multicrystalline silicon thin films, single crystal silicon thin films, III-V compounds including gallium-arsenide (GaAs), Gallium-Indium-Phosphorus (GaInP), Gallium-Indium-Arsenide (GaInAs), and others. In addition to the semiconductor n/p layers, the photovoltaic cell 106 includes a top metallic grid 214 or other electrical contact for collecting electric current from the cell and transferring electric current to an external load. A back contact layer 216 is included to complete the electrical circuit. On the top surface of the complete cell, a transparent encapsulant 218 constructed from a material such as glass or plastic seals the cell. An antireflective coating 220 on a top surface of the photovoltaic cell 106 is included to prevent light 222 from reflecting away from the photovoltaic cell 106. A transparent adhesive layer 224 affixes the transparent encapsulant 218 to the photovoltaic cell 106.

Figure 3:
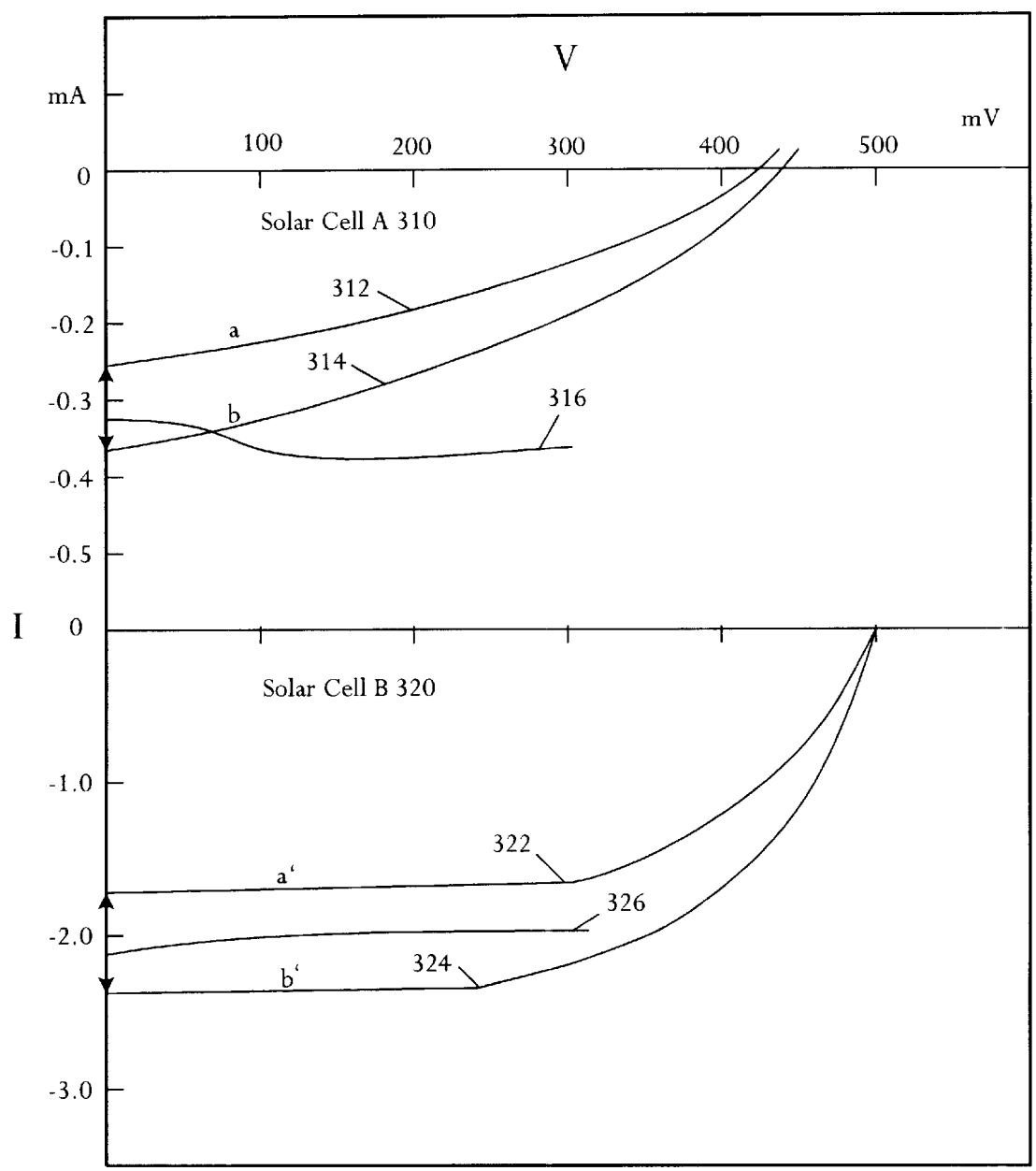
FIG. 3 is a graph showing two photovoltaic response plots with current-voltage (I-V) characteristics for two different commercial silicon (Si) solar cells operated under natural illumination under cloudy or rainy conditions.

Referring to FIG. 3, two photovoltaic response plots show current-voltage (I-V) characteristics for two different commercial silicon (Si) solar cells operated under natural illumination under cloudy or rainy conditions with an illumination intensity of 4400 Lx. An I-V response curve 312 and an I-V response curve 322 illustrate photovoltaic responses of conventional operation of solar cell A 310 and solar cell B 320, respectively, set in a shallow, wide panel tray 102. In the example, solar cell A 310 has a square form with an effective front area of 5×5 $mm^2$. Solar cell B 320 has a rectangular form with an effective front area of approximately 10×20 $mm^2$.

In conventional operation, liquid is not added to the tray. An I-V response curve 314 and an I-V response curve 324 illustrate photovoltaic responses for the solar cell A 310 and solar cell B 320, respectively, for operation of the photovoltaic cells 106 immersed in organic dielectric liquid 110. In the illustrative example, solar cell A 310 and solar cell B 320 are immersed in glycerin which fills the panel tray 102 to a level slightly above the front face of the respective solar cell. The improvement in output power of the photovoltaic cells 106 is depicted by an increment in short circuit current $I_{SC}$. The short circuit current $I_{SC}$ increment 316 for solar cell A 310 is approximately 40% and the short circuit current $I_{SC}$ increment 326 for solar cell B 320 is approximately 36%. Output power for the solar cell depends on the load applied to the cell. For example, the incremental output power of solar cell B 320 for a 200Ω load is approximately 47% when the solar cell is immersed in the glycerin fluid.

Under the same illumination condition, performance of the solar cells is substantially improved by operating the photovoltaic cells 106 partly or fully immersed in organic dielectric liquid 110. Improvements in output power performance of a solar cell vary according to numerous factors including composition of the liquid and depth of the liquid in relation to solar cell size.

Figure 4:
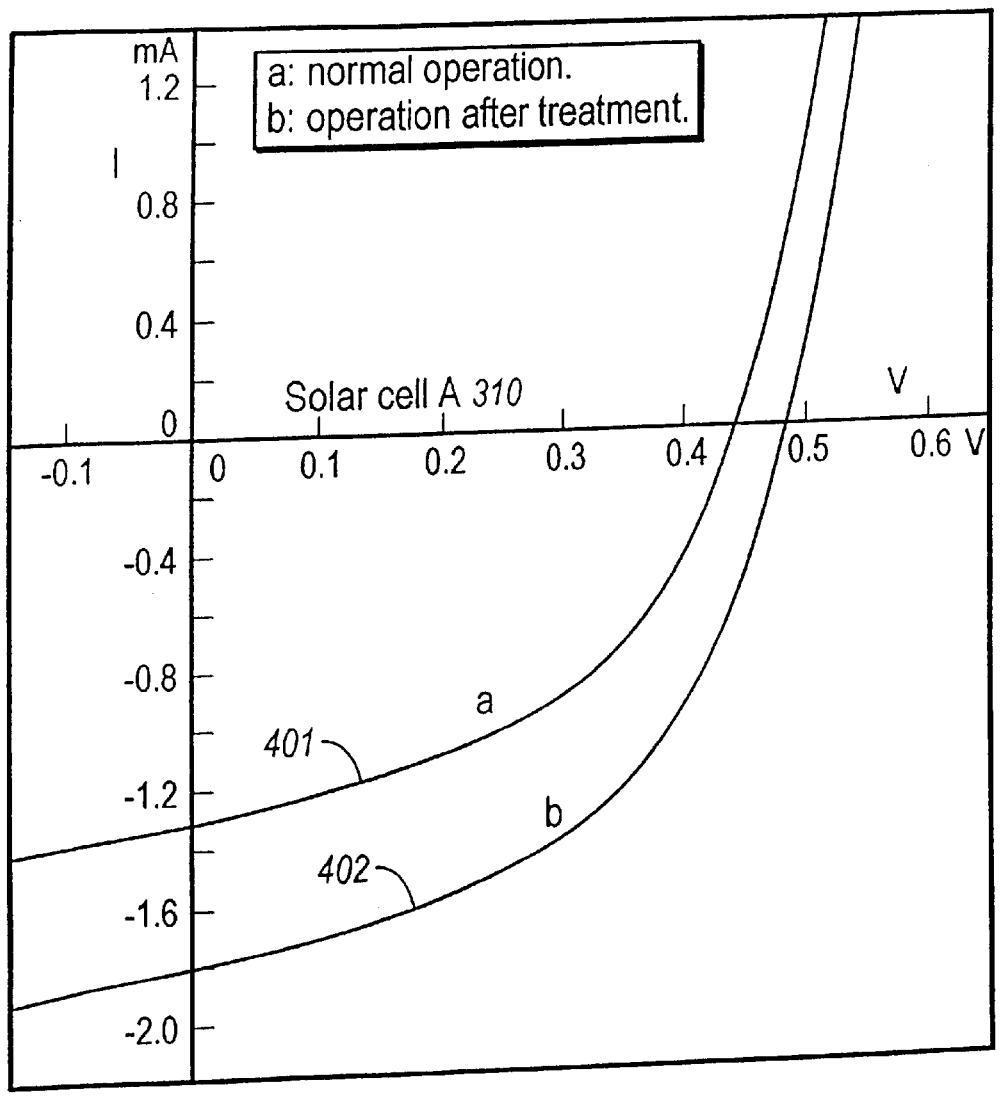
FIG. 4 is a graph that illustrates a photovoltaic response plot including current-voltage (I-V) characteristics for a commercial silicon (Si) solar cell operated under natural illumination under an air mass value AM 1.5 on natural solar radiation of a clear sky.

Referring to FIG. 4, a photovoltaic response plot shows current-voltage (I-V) characteristics for a commercial silicon (Si) solar cell A 310 operated under natural illumination under an air mass value AM 1.5 on natural solar radiation of a clear sky. Curve 401 shows the I-V characteristic for operation of a solar cell in air. Curve 402 shows the I-V characteristic with the solar cell immersed in ethyl alcohol. The improvement of short circuit current $I_{SC}$ and open current voltage $V_{OC}$ for the solar cell in liquid is about 38% and about 10%, respectively. The improvement in output power is approximately 64% when the solar cell is connected to a 250Ω load, and approximately 23% when the solar cell is connected to a 1000Ω load.

Figure 5:
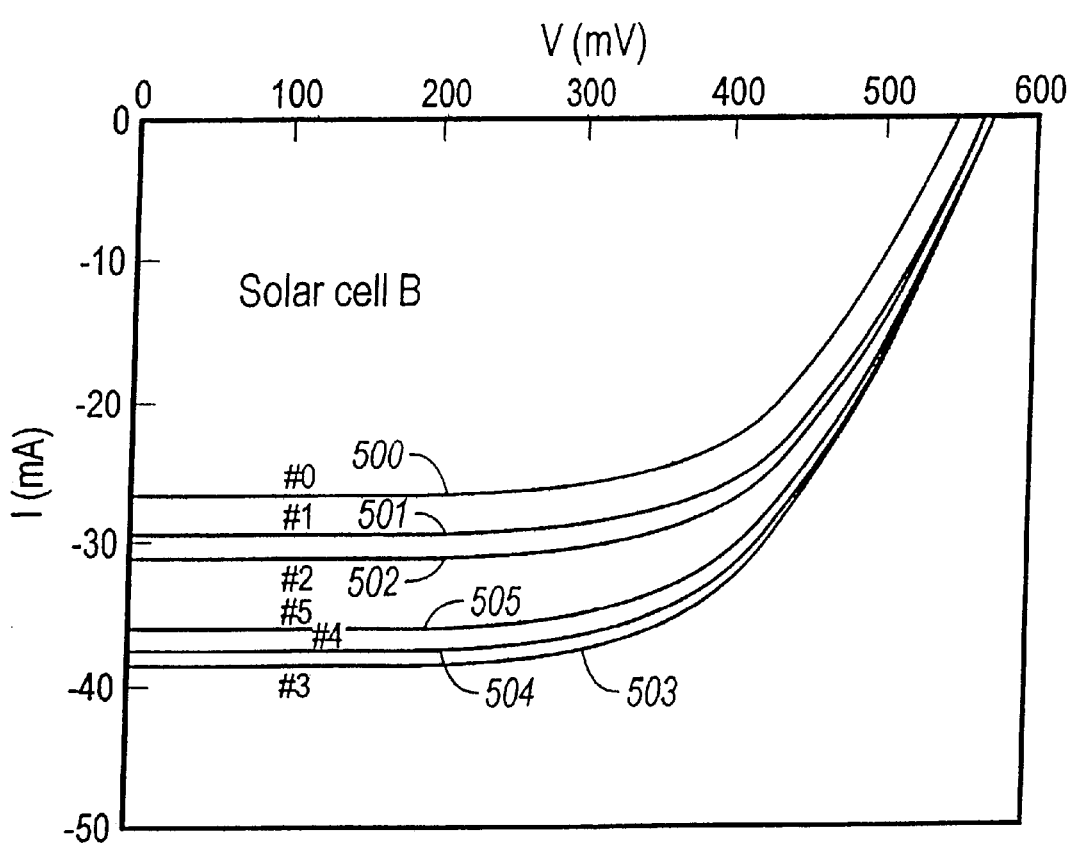
FIG. 5 is a graph of a photovoltaic response plot showing current-voltage (I-V) characteristics for a commercial silicon (Si) solar cell immersed in various depths of organic dielectric liquid.

Referring to FIG. 5, a photovoltaic response plot shows current-voltage (I-V) characteristics for a commercial silicon (Si) solar cell immersed in various depths of organic dielectric liquid 110 under vertical illumination with 10000 Lx from a 500W/5500° K. color temperature reflection lamp. In one example, the photovoltaic cell 106 is the solar cell B 320 and the organic dielectric liquid 110 is trichloroethylene. A curve 500 shows an I-V characteristic for a conventional condition with no liquid. The trichloroethylene fluid has a shallow depth to produce a curve 501 in which the fluid only coats the surface of solar cell B 320 nearest the panel tray 102. Output power efficiency improves simply by wetting the back surface of the photovoltaic cell 106. Efficiency is further improved by increasing the fluid depth to cover the entire photovoltaic cell 106. Curve 502 results when the fluid depth covers the photovoltaic cell 106 so that the fluid level is 1 mm above the top surface of the photovoltaic cell 106. In the illustrative example, the optimum fluid depth of trichloroethylene for solar cell B 320 covers the top surface of the cell by 7 mm, as shown by curve 503. Additional fluid reduces the efficiency of solar cell B 320 as shown by curve 504 and 505. Curve 504 results when the solar cell B 320 is covered by 10 mm over the top surface of the cell. Curve 505 results when the solar cell B 320 is covered by 15 mm over the top surface of the cell.

Similar measurements result when photovoltaic cells 106 are immersed in various organic dielectric liquids 110 such as toluene, isopropyl alcohol, and glycerin. The maximum output power from the solar cell occurs at the depth of 7±1 mm above the upper surface of the cells for the listed organic dielectric liquids 110. In other examples, the optimum fluid depth may vary according to the particular organic dielectric liquid 110 that is selected and configuration of the tray such as tray diameter.

The most suitable depth of the organic dielectric liquid 110 appears to relate to light focusing over the location of the photovoltaic cell 106 in the panel tray 102.

Maximum output power measurements acquired under illumination from a 500W/5500° K. color temperature lamp using organic dielectric liquids 110 of glycerin, isopropyl alcohol, toluene, and trichloroethylene shown in Table I. Table I illustrates the maximum increment of short circuit current $I_{SC}$, $(\Delta I_{SC}/I_{SC})_{max}$, in solar cell B 320 in a liquid depth D. The specific weight p and refractive index N are given for the organic dielectric liquids 110. Among the organic dielectric liquids, glycerin is a non-polar dielectric. Isopropyl alcohol, toluene, and trichloroethylene are polar dielectric.

TABLE I

| Liquid | ρ | N | $(\Delta I_{SC}/I_{SC})_{max}$ | D (mm) |
|---|---|---|---|---|
| Trichloroethylene | 1.439 | 1.471 | 0.44 | 7 ± 1 |
| Toluene | 0.8669 | 1.496 | 0.42 | 7 ± 1 |
| Isopropyl Alcohol | 0.7855 | 1.3776 | 0.31 | 7 ± 1 |
| Glycerin | 1.2613 | 1.4746 | 0.27 | 7 ± 1 |

As shown in Table I, any polar dielectric liquid with a high index of refraction N is suitable to enhance greater output power of junction solar cells due to wetting effect.

The increment of power increase using a dielectric is related to the dielectric constant. Two materials have been found to be particularly appropriate for use as the dielectric overlying the solar cell. These materials have an index of refraction greater than 1.43, a freezing point less than −40° centigrade and a boiling point greater than 200° centigrade. Thus the dielectric material with these characteristics can be used at most points on earth, including the Arctic and the tropics. The dielectric material should be free of chlorine, iodine or bromine because such materials are not suitable in case of fire. One appropriate material which resulted in a 42% power increase when used on top of a solar cell was propylene glycol (N=1.433). Propylene glycol is used for antifreeze in automobiles and has been discovered to be safe for use as a dielectric fluid in covering a solar cell to increase power output. In case of fire, the byproducts of burning propylene glycol are carbon dioxide ($CO_2$) and carbon monoxide (CO).

Figure 8A:
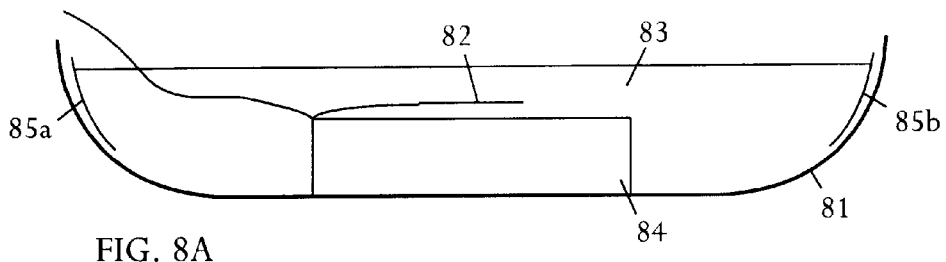
FIGS. 8a and 8b depict the structure for testing a solar cell in accordance with this invention.
Figure 8B:
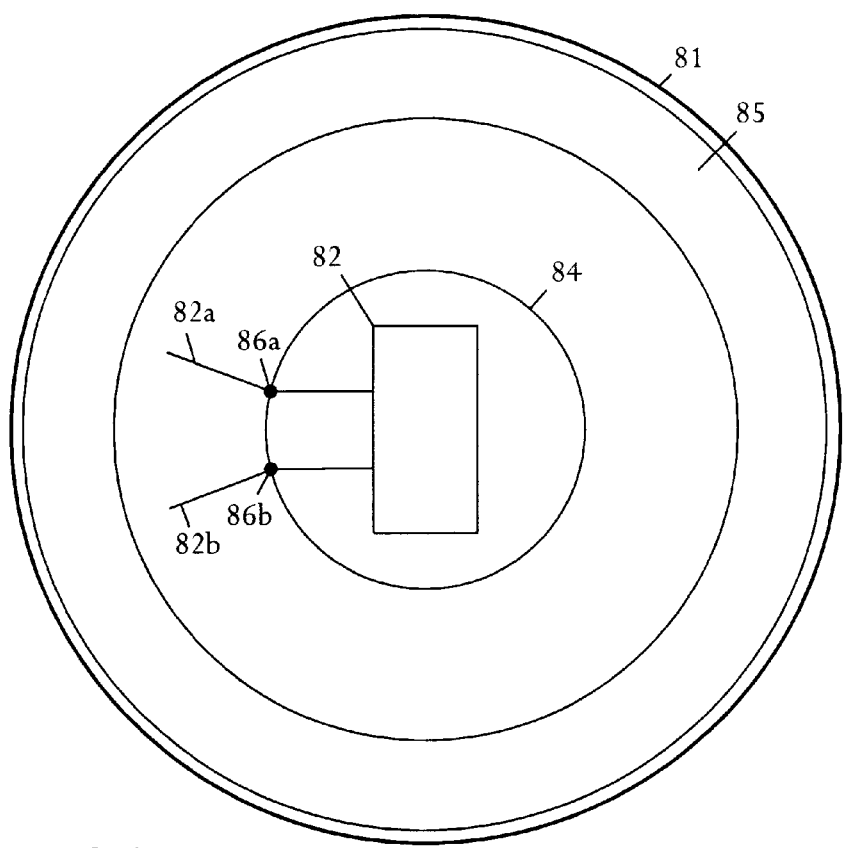

Another material which resulted in a 63% increase in power output is from Cargille and is a dielectric liquid for optics. In particular, the Cargille material is described in Cargille literature as an immersion liquid for lasers. The index of refraction is 1.535, the material freezes at −45° centigrade and boils at greater than 370° centigrade. The material is safe in that it produces $CO_2$ if burned and is stable for greater than 10 years in sunlight. The material was tested to determine the increase of solar cell output. The structure in which tests were run is shown in FIGS. 8A and 8B. FIG. 8A shows a ceramic bowl 81 the walls of which are covered by a white 3M Scotch™ tape 85. Cross sections 85a and 85b of this tape are shown in FIG. 8A while in FIG. 8B a top view of the structure of FIG. 8A shows the 3M Scotch™ tape placed around the interior of the bowl below the top edge. Solar cell 82 is spaced a distance "d" (1 mm) from the epoxy base 84 which is glued to the bottom of the ceramic bowl. The solar cell 82 has two lead wires 82a and 82b which support the solar cell the 1 mm distance above the epoxy base 84 in a cantilevered fashion. Lead wires 82a and 82b are attached to the epoxy base 84 by glue 86a and 86b. Tests showed that $\Delta I_{SC}/I_{SC}$, which is the ratio of the short circuit current improvement over the normal short circuit current were such that the maximum power improvement was 62.6% using the Cargille™ immersion liquid code 1160 with a refractive index of 1.535. This liquid 83 is manufactured by R. P. Cargille Laboratories, Inc., at 55 Commerce Rd., Cedar Grove, N.J., 07009. The characteristics of this material are given in the material safety data sheet produced by Cargille relating to this material.

Output power efficiency increases when a solar cell is operated in a highly electrically resistive and optically transparent liquid. Generally, any liquid that is electrically resistive and optically transparent in the wavelength region from 3000 Å to 20000 Å is suitable. Any organic dielectric liquid, whether polar or nonpolar, is suitable for usage in a solar panel. Greater energy conversion efficiency is attained for a polar organic dielectric liquid with increasing efficiency for liquids with a relatively higher index of refraction such as toluene or trichloroethylene. In a practical application, the organic dielectric liquid can also be selected according to the climate and likely seasonal weather conditions of the solar energy panel installation based on the melting point and the boiling point of various liquids. Generally, an organic dielectric liquid 110 with a lower freezing temperature and a higher boiling temperature is advantageous to prevent damage from freezing in cold conditions and to more efficiently utilize solar energy in hot conditions.

In some embodiments, the liquid need not be an organic dielectric liquid 110 but rather can be an electrically nonconductive and optically transparent dielectric such as pure water to observe an increase of output power of junction solar cells.

Figure 6:
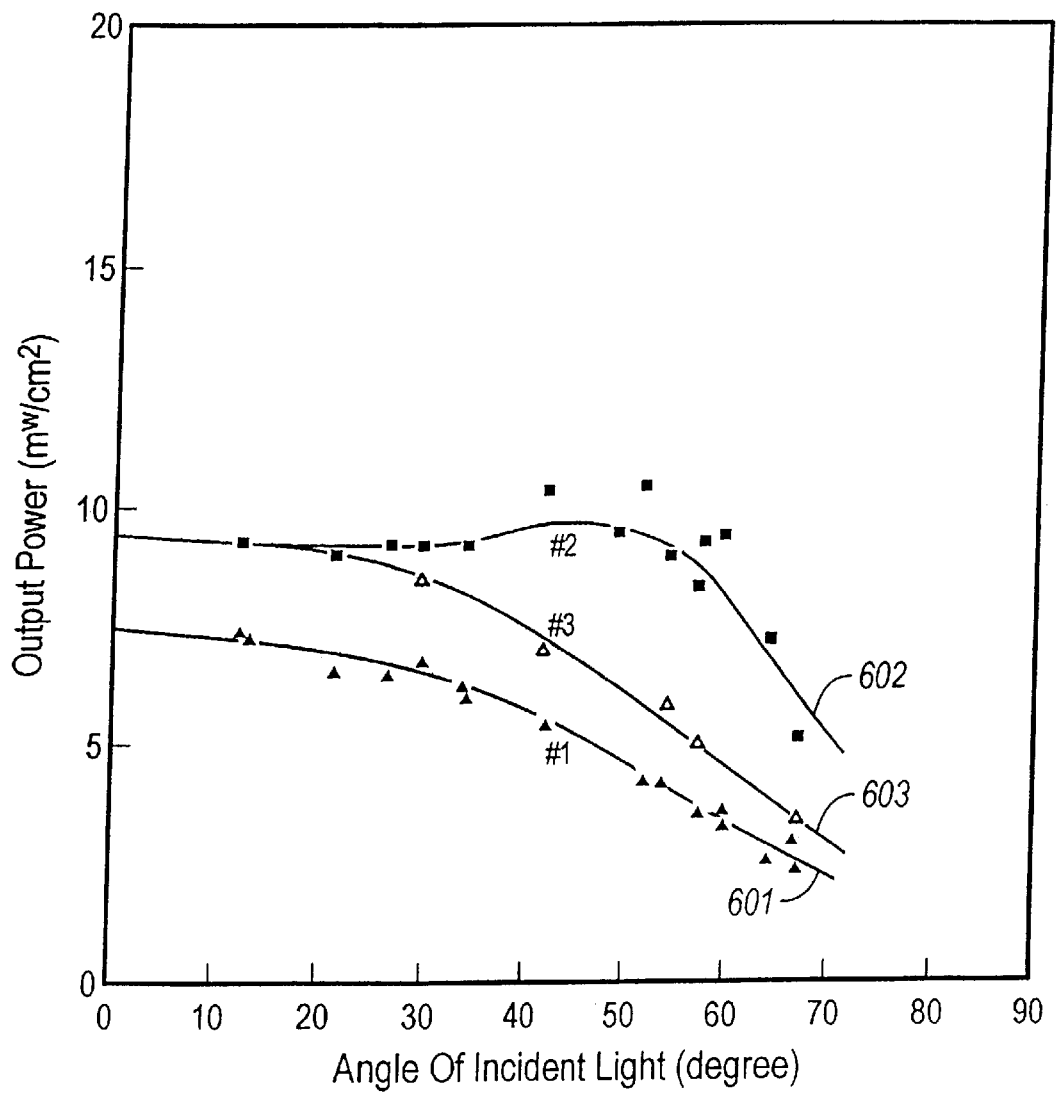
FIG. 6 is a graph that depicts the relationship of output power to the angle of light incident on the photovoltaic cell.

Referring to FIG. 6, a graph depicts the relationship of output power to the angle of light incident on the photovoltaic cell 106. In the illustrative example, the maximum output power is measured from a solar cell as a function of the angle of incidence at which sunlight strikes the front face of the solar cell 106 and/or a side wall of the solar panel system 104. Measurements are taken with the photovoltaic cell 106 in air or in organic dielectric liquid 110. Data are collected in conditions of natural sunlight with a clear sky. At a plurality of angles of the sun, a point on a control curve 601 is acquired in air. For the multiple angles, ethanol is poured into a 10 cm diameter petri dish holding the photovoltaic cell 106 to a depth level 7 mm higher than the top surface of the photovoltaic cell 106, and a point on an illuminated test curve 602 is acquired. Also for each angle, an inserted shutter 114 blocks the sunlight to the side wall of the petri dish that is refracted through the side wall to the photovoltaic cell 106, and a point on a blocked-illumination test curve 603 is acquired. At all angles of the incident light, the difference between the blocked-illumination test curve 603 and the control curve 601 is caused by wetting the photovoltaic cell with organic dielectric liquid 110. For all angles of the incident light, the difference between the illuminated test curve 602 and the blocked-illumination test curve 603 results from differences in illumination by sunlight refracted through the side wall of the petri dish.

In the illustrative test, the presence of ethanol around the photovoltaic cell 106 results in an increase of approximately 33% in the output power during daylight, as is shown by blocked-illumination test curve 603. More than 35% of the increase in output power results from sunlight refracted through the side wall of the dish to the photovoltaic cell 106. In total, approximately a 68% increase in output power is obtained during a sunny day.

Figure 7:
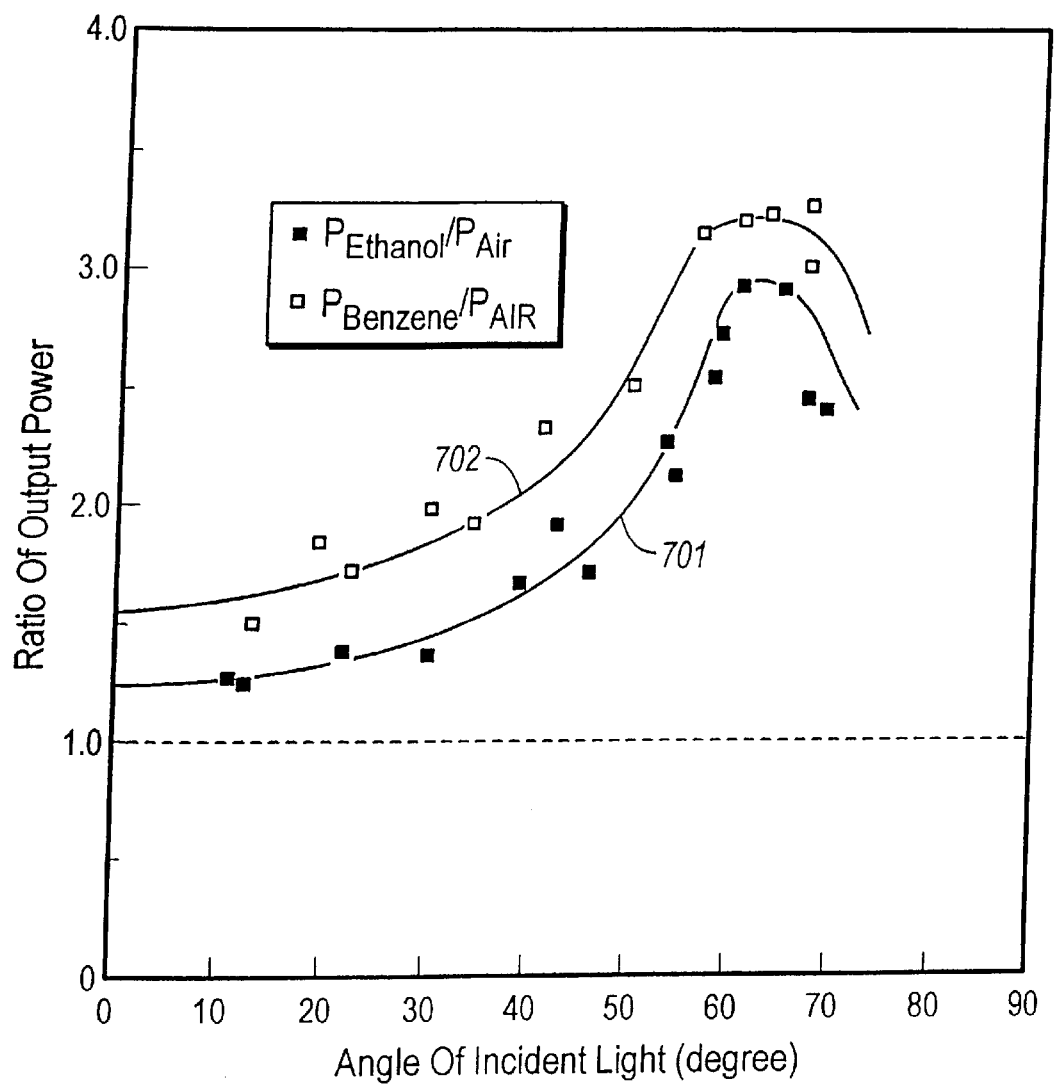
FIG. 7 is a graph that illustrates the ratio of maximum output power received from a photovoltaic cell immersed in organic dielectric liquid as a function of incident light angle.

Referring to FIG. 7, a graph 701 illustrates the ratio of maximum output power curve 602 from a photovoltaic cell 106 immersed in ethanol 110 to that of control curve 601 in air in FIG. 6. Similar experimental test points 702 show the same power ratios obtained comparing cell efficiency in liquid to cell efficiency in air for benzene fluid baths. The geometry of the solar panel 100 including aspects of the transparent panel lid 112, the transparent panel walls 104, the geometry of the panel walls 104 to focus solar energy in the organic dielectric liquid 110, operates to increase solar cell efficiency.

A solar panel 100 that utilizes the disclosed geometry and organic dielectric liquid extracts an enhanced output power from the solar cells at incident illumination angles from 10° to 75°, the full range of effective sunlight angles, without tracking sun position. The illustrative example 701 shows an increase of approximately 70% in the output power for a day using a solar cell immersed in ethanol. The example 702 shows an increase of approximately 120% in the output power for a day using a solar cell immersed in benzene.

During a year, as the season changes, an angle of elevation of the sun at noon varies between $\phi+23.5°$ and $\phi-23.5°$ at a point with the latitude $\phi$ on the earth. A result derived from FIGS. 6 and 7 suggests that the direction of the solar panel plane needs to be selected to effectively utilize the fallen light on the side wall of the system according to the latitude of the location on the earth.

The increased efficiency at low angles of incidence results from the collection of incident light through the side wall of the panel. A large efficiency increase is attained not only in bright sunlight, but also during hazy or cloudy conditions. For example, a nearly 50% increase in output power is observed in the operation of solar cells immersed in ethanol under a cloudy sky with an illumination intensity of about 4800 Lx.

The structure of the illustrative solar panel, including solar cells immersed in liquid and encapsulated within the panel, can have various other benefits for extraction of additional power. For example, the solar panel can include pumps or other devices for circulating the liquid, so solar cells can be cooled to depress the decrease in output power that results from a rise in liquid temperature. Circulating the liquid also permits simultaneous collection of solar thermal energy from the liquid.

In an additional embodiment of this invention, a solid dielectric film is deposited over the surfaces of the p-n junction cells. The dipoles of the solid dielectric film are polarized along the self-induced electric field across the p-n junction.

Referring again to FIG. 5, curve 501 illustrates a result of wetting rear surface 1014 of solar cell 1010 with dielectric liquid 1016. In this embodiment, the ratio of the Isc of curve 501 to that of curve 500 indicates that about an 11% increase in the short circuit current can be obtained by wetting the rear surface of the solar cell with, for example, trichloroethylene. Although, FIGS. 9A and 9B provide one exemplary embodiment for the design of mounting table 1002, the design of the solar cell mounting table can be designed in any manner which ensures that the rear solar cell surface is allowed to be wet.

Figure 9A:
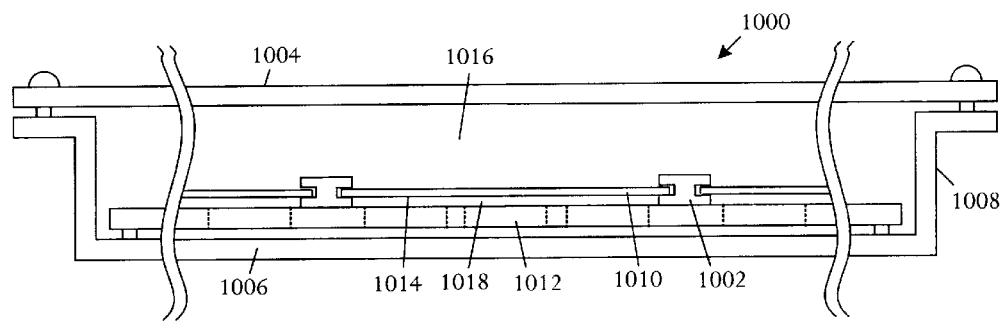
FIGS. 9A and 9B illustrate a side and top view, respectively, of an embodiment of a solar cell panel encapsulating system including a solar cell mounting table.
Figure 9B:
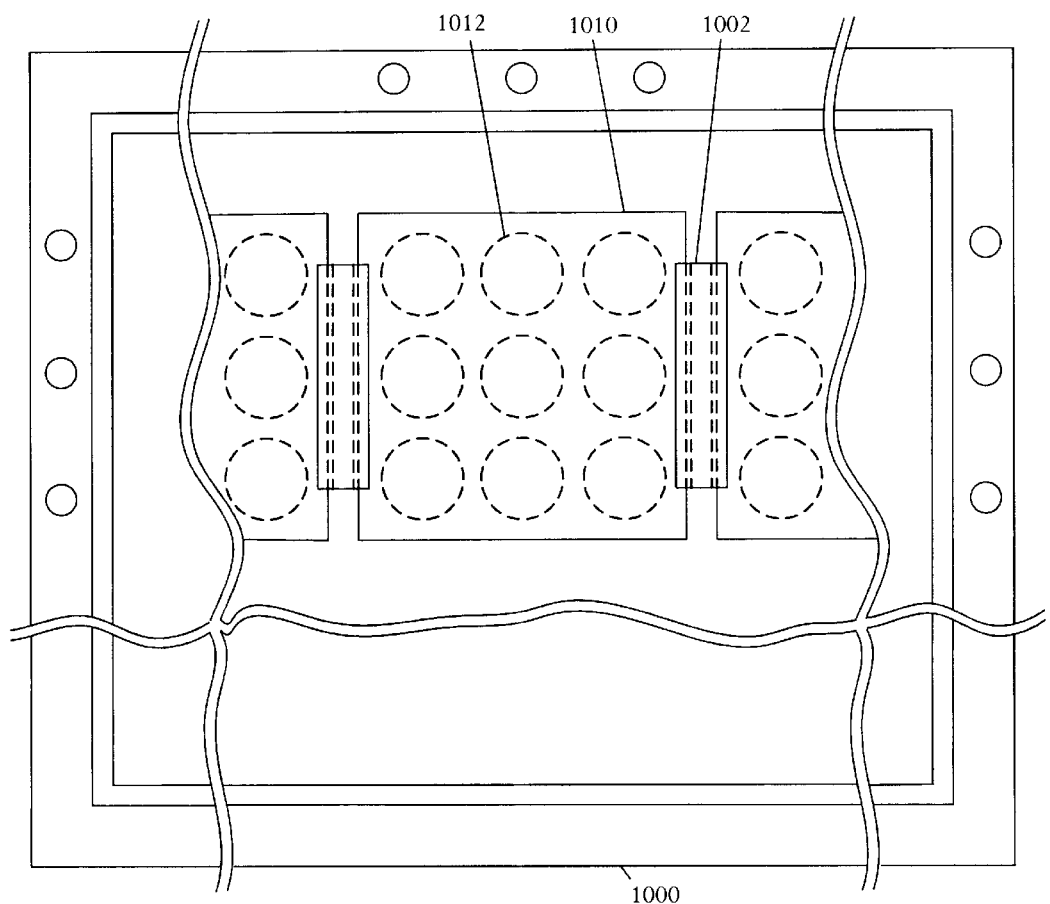

FIGS. 9A and 9B are illustration of the side and top view, respectively, of solar panel encapsulating system 1000 including a solar cell mounting table 1002. In this embodiment, encapsulating system 1000 includes a transparent lid 1004, a tray 1006, and transparent side walls 1008. Encapsulation system 1000 encloses an array of solar cells 1010 mounted or placed on mounting table 1002, which defines a set of holes 1012. Holes 1012 are located on mounting table 1002 to provide a space 1018 proximate to the rear surface 1014 of solar cell 1010. Space 1018 allows a dielectric liquid 1016 to pool proximate to rear surface 1014 such that the entire rear surface can be made wet. In one example, space 1018 provides no less than a 1 mm gap.

While the invention has been described with reference to various embodiments, it will be understood that these embodiments are illustrative and that the scope of the invention is not limited to them. Many variations, modifications, additions and improvements of the embodiments described are possible. For example, those of ordinary skill in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

In the claims, unless otherwise indicated the article "a" is to refer to "one or more than one".

What is claimed is:

1. A solar energy converter comprising:
    a thin panel enclosure having a two-dimensional flat base, short side walls, and a transparent lid separated from the flat base by the short side walls, the short side walls enclosing an interior cavity having a depth substantially smaller than either of the two-dimensional base dimensions;
    one or more solar cells contained within the thin panel enclosure and having a front surface and back surface;
    a support contained within the thin panel enclosure that holds the one or more solar cells separate from the base and lid; and
    a thin layer of liquid contained within the thin panel enclosure and bathing the one or more solar cells, wetting both the front surface and back surface of the one or more solar cells.

2. The solar energy converter according to claim 1 wherein:
    the support separates the one or more solar cells from the base by more than 1 mm.

3. The solar energy converter according to claim 1 wherein:
    the liquid covers the front surface of the one or more solar cells by 15 mm or less.

4. The solar energy converter according to claim 1 wherein:
    the thin layer of liquid is selected from among a group of liquids comprising water, electrically nonconductive and optically transparent dielectric liquids, polar organic dielectric liquids, nonpolar organic dielectric liquids, a dielectric liquid with an index of refraction greater than 1.43, a freezing point less than −40° C., and a boiling point greater than 200° C., and an immersion liquid for lasers with an index of refraction of approximately 1.535, a freezing point less than −45° C., and a boiling point greater than 370° C.

5. The solar energy converter according to claim 1 wherein:
    the support is a mounting table.

6. The solar energy converter according to claim 1 wherein:
    the short side walls are selected from among a group including transparent walls and opaque walls.

7. The solar energy converter according to claim 1 wherein:
    the thin panel enclosure is selected from among a group of enclosures including enclosures further comprising circulating devices and capable of circulating the liquid to cool the solar cells, and enclosures that completely enclose the liquid without apertures for circulating the liquid, the wetting of the front surface and back surface of the one or more solar cells being sufficiently efficient that cooling of the liquid is not required.

8. A solar energy converter comprising:
    a thin panel container enclosing an interior cavity;
    one or more solar cells disposed within the thin panel container and having a front surface and back surface that are separated from interior walls of the thin panel container; and
    a thin layer of liquid contained within the thin panel container and bathing the one or more solar cells, wetting both the front surface and the back surface of the one or more solar cells and covering the front surface of the one or more solar cells by a liquid depth of 15 mm or less.

9. The solar energy converter according to claim 8 wherein:
    the thin layer of liquid is selected from among a group of liquids comprising water, electrically nonconductive and optically transparent dielectric liquids, polar organic dielectric liquids, nonpolar organic dielectric liquids, a dielectric liquid with an index of refraction greater than 1.43, a freezing point less than −40° C., and a boiling point greater than 200° C., and an immersion liquid for lasers with an index of refraction of approximately 1.535, a freezing point less than −45° C., and a boiling point greater than 370° C.

10. A solar energy converter comprising:
    a liquid;
    one or more solar cells each having an n-type semiconductor layer and a p-type semiconductor layer forming a single n/p junction distributed such that a front surface and a back surface of said one or more solar cells are in contact with the liquid; and
    an encapsulation system enclosing the liquid and the one or more solar cells, the encapsulation system having a flat base that supports the one or more solar cells, the encapsulation system having transparent lateral panel walls connected to the base forming a lens that focuses solar illumination through the liquid to the one or more solar cells, the walls enhancing collection of light thorough the walls and through the liquid and optically concentrating solar energy to the one or more solar cells, wherein the liquid covers the front surface of the one or more solar cells by 15 mm or less.

11. The solar energy converter according to claim 10 wherein:
    the liquid is an organic dielectric liquid that is selected from among polar dielectric liquids and nonpolar dielectric liquids.

12. The solar energy converter according to claim 10 further comprising:

the encapsulation system having a transparent cover that allows solar illumination to permeate through the liquid.

13. The solar energy converter according to claim 10 further comprising:

the encapsulation system in a configuration of a cylindrical structure with a flat panel tray covering a first end of the cylindrical structure and a panel cover or lid covering a second end of the cylinder structure.

14. The solar energy converter according to claim 10 further comprising:

the encapsulation system comprising walls and a cover at least partially constructed from transparent glass or plastic.

15. The solar energy converter according to claim 10 wherein:

the encapsulation system has a base and cover area that is larger than a total surface area covered by the one or more solar cells.

16. The solar energy converter according to claim 10 further comprising:

the encapsulation system in a configuration of a cylindrical structure with a flat panel tray covering a first end of the cylindrical structure and a panel cover or lid covering a second end of the cylidrical structure, the cylindrical structure having a cross-sectional geometry selected from among a circle, an ellipse, an oval, an egg-shape, a rectangle, a triangle, a square and being selected from among a symmetric shape and an asymmetric shape.

17. The solar energy converter according to claim 10 wherein:

the encapsulation system is a thin panel enclosure having a two-dimensional flat base, lateral panel walls comprising short side walls, and a transparent lid separated from the flat base by the short side walls, the short side walls enclosing an interior cavity having a depth substantially smaller than either of the two-dimensional base dimensions.

18. The solar energy converter according to claim 10 wherein:

the liquid is selected from among a group of liquids comprising water, electrically nonconductive and optically transparent dielectric liquids, polar organic dielectric liquids, nonpolar organic dielectric liquids, ethanol, benzene, toluene, tricholoroethylene, propylene glycol, a dielectric liquid with an index of refraction greater than 1.43, a freezing point less than −40° C., and a boiling point greater than 200° C., and an immersion liquid for lasers with an index of refraction of approximately 1.535, a freezing point less than −45° C., and a boiling point greater than 370° C.

* * * * *